(12) United States Patent
Wu et al.

(10) Patent No.: US 12,320,878 B2
(45) Date of Patent: Jun. 3, 2025

(54) SYSTEMS AND METHODS FOR MAGNETIC RESONANCE IMAGE RECONSTRUCTION FROM INCOMPLETE K-SPACE DATA

(71) Applicant: THE UNIVERSITY OF HONG KONG, Hong Kong (HK)

(72) Inventors: Ed Xuekui Wu, Hong Kong (HK); Yilong Liu, Hong Kong (HK); Linfang Xiao, Hong Kong (HK)

(73) Assignee: THE UNIVERSITY OF HONG KONG, Hong Kong (HK)

( * ) Notice: Subject to any disclaimer, the term of this patent is extended or adjusted under 35 U.S.C. 154(b) by 400 days.

(21) Appl. No.: 17/797,119

(22) PCT Filed: Feb. 2, 2021

(86) PCT No.: PCT/CN2021/074848
§ 371 (c)(1),
(2) Date: Aug. 3, 2022

(87) PCT Pub. No.: WO2021/155782
PCT Pub. Date: Aug. 12, 2021

(65) Prior Publication Data
US 2023/0055826 A1 Feb. 23, 2023

Related U.S. Application Data

(60) Provisional application No. 63/041,183, filed on Jun. 19, 2020, provisional application No. 62/969,663, filed on Feb. 4, 2020.

(51) Int. Cl.
*G01R 33/561* (2006.01)
*G01R 33/56* (2006.01)

(52) U.S. Cl.
CPC ....... *G01R 33/5608* (2013.01); *G01R 33/561* (2013.01)

(58) Field of Classification Search
None
See application file for complete search history.

(56) References Cited

U.S. PATENT DOCUMENTS

| 2013/0181710 A1* | 7/2013 | Setsompop | G01R 33/543 324/309 |
| 2019/0213761 A1* | 7/2019 | Rosen | A61B 8/463 |
| 2019/0257905 A1* | 8/2019 | Cheng | G01R 33/5608 |
| 2019/0266761 A1 | 8/2019 | Malkiel et al. | |

(Continued)

OTHER PUBLICATIONS

International Search Report, Written Opinion and International Preliminary Report for International Application No. PCT/CN2021/074848 mailed on Apr. 27, 2021, 23 pages.

*Primary Examiner* — Idowu O Osifade
(74) *Attorney, Agent, or Firm* — Amin, Turocy & Watson, LLP

(57) ABSTRACT

Disclosed are deep learning based methods for magnetic resonance imaging (MRI) image reconstruction from partial Fourier-space (i.e., k-space) data, involving: obtaining high-quality complex MRI image data or fully-sampled k-space data as training data; training reconstruction models to predict high-quality complex MRI image data or complete k-space data from incomplete or partial k-space data; and applying trained models to reconstruct high-quality complex MRI image data or complete k-space data from partial k-space data.

19 Claims, 8 Drawing Sheets

(56) References Cited

U.S. PATENT DOCUMENTS

2020/0008701 A1* 1/2020 Ye .................... A61B 5/055
2020/0090382 A1 3/2020 Huang et al.
2020/0217914 A1 7/2020 Huang et al.

* cited by examiner

SYSTEMS AND METHODS FOR MAGNETIC RESONANCE IMAGE RECONSTRUCTION FROM INCOMPLETE K-SPACE DATA

This international patent application claims the benefit of U.S. Provisional Patent Application No. 62/969,663 filed on Feb. 4, 2020 and U.S. Provisional Patent Application No. 63/041,183 filed on Jun. 19, 2020, the entire contents of which are incorporated by reference for all purpose.

TECHNICAL FIELD

Disclosed are systems and methods involving deep learning based methods for magnetic resonance imaging image reconstruction.

BACKGROUND

Magnetic resonance imaging (MRI) is widely used during clinical diagnosis, prognosis and treatment of various diseases. The raw data acquired by MRI scanners are Fourier-space (i.e., k-space) samples, which can be converted (i.e., reconstructed) to MRI images by reconstruction methods. The quality of MRI images is partly determined by the reconstruction methods, particularly when the k-space samples are not completely or fully acquired during data acquisition in order to accelerate scan for imaging efficiency or/and patient comfort. Despite the excellent spatial resolution and soft tissue contrast, clinical MRI suffers from the intrinsic limitation of generally long scan time. In practice, partial Fourier data acquisition is often performed during k-space sampling, e.g., along phase encoding direction or/and frequency encoding directions to accelerate scan or shorten echo time, respectively. Subsequently missing k-space data are often estimated using the projection onto convex sets (POCS) method, yet such conventional method decreases image signal to noise ratio (SNR) and its performance is suboptimal in presence of rapid image phase variations especially when partial Fourier fraction is low.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

Disclosed herein are a new class of deep learning systems and methods for robust partial Fourier reconstruction. These methods involve (i) building and training the reconstruction models (e.g., convolution neural networks or CNNs) by large amount of high-quality complex MRI image data or fully-sampled k-space data; and (ii) applying the trained models to reconstruct high-quality complex MRI images or complete k-space data from partial Fourier data that are incompletely sampled, for example, along phase encoding or/and frequency encodings directions. The new methods produce high SNR and high-resolution image reconstruction from rapidly acquired incomplete partial Fourier k-space data while preserving image fidelity including phase information, which significantly outperform the conventional POCS reconstruction method.

Also disclosed are methods for MRI reconstruction of partial Fourier k-space data using deep learning models, involving obtaining large training data comprising complex MRI images or fully-sampled k-space data; training reconstruction models to predict high-quality complex MRI images or complete k-space data from incomplete k-space data; and reconstructing high-quality MRI images from individual incomplete k-space data that are partially sampled by using the trained reconstruction models.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Deep learning based methods for magnetic resonance imaging (MRI) image reconstruction from partial Fourier-space (i.e., k-space) data are provided, including one or more of: obtaining high-quality complex MRI image data or fully-sampled k-space data as training data; training reconstruction models to predict high-quality complex MRI image data or complete k-space data from incomplete or partial k-space data; and applying trained models to reconstruct high-quality complex MRI image data or complete k-space data from partial k-space data. Essentially, deep learning based methods are used for MRI reconstruction from partial k-space data.

Figure 1:
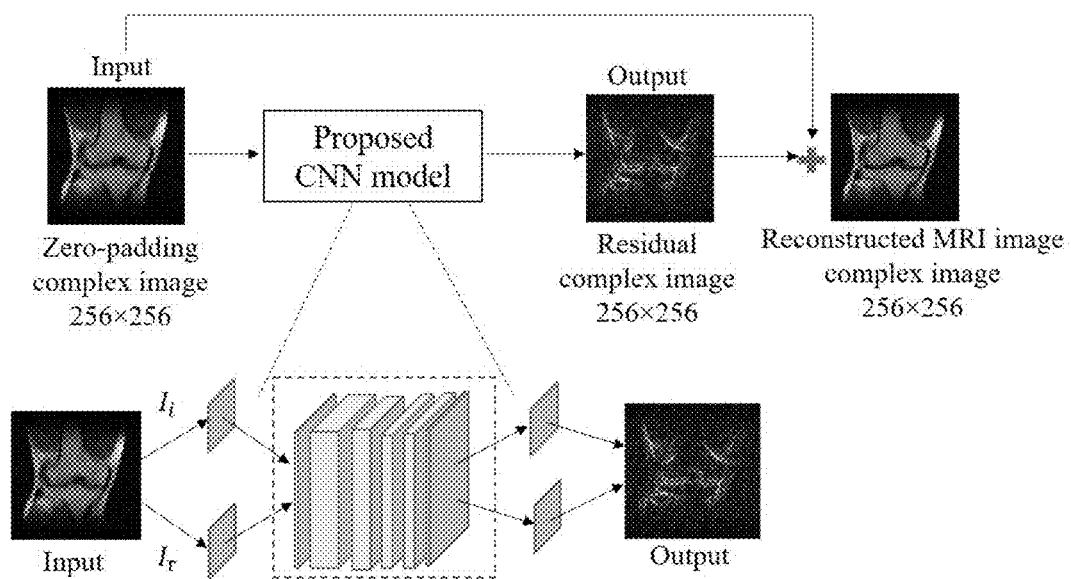
FIG. 1 depicts the deep learning models for partial Fourier reconstruction in accordance with embodiment. For simplicity, the CNN model architecture and method are illustrated to exemplify the reconstruction of high-quality 2D image data from partial Fourier 2D k-space data. The input of the network is a 3D matrix 256×256×2 for the complex image data. The k-space data has two channels corresponding to the real and imaginary parts, respectively. The output is also a 3D matrix 256×256×2 for the residual image. The kernel sizes of the five convolutional layers are 9×9, 7×7, 5×5, 5×5 and 3×3, respectively. The numbers of kernels are 128, 64, 32, 32 and 2, respectively. After the training, the input and output are combined for a reconstructed MRI image. Note that such models can be expanded to 3D and multi-channel data.

A number of deep learning models can be used in the training and testing (i.e., reconstruction) procedure. For example, the relatively simple CNN model is shown in FIG. 1. For illustration purpose, this model has five convolutional layers and each layer is followed by the batch normalization layer and the activation function. The real and imaginary parts of the original images act as two channels of the input for the network. Similarly, the two channels of the output are the real and imaginary parts of the predicted residual.

Figure 2:
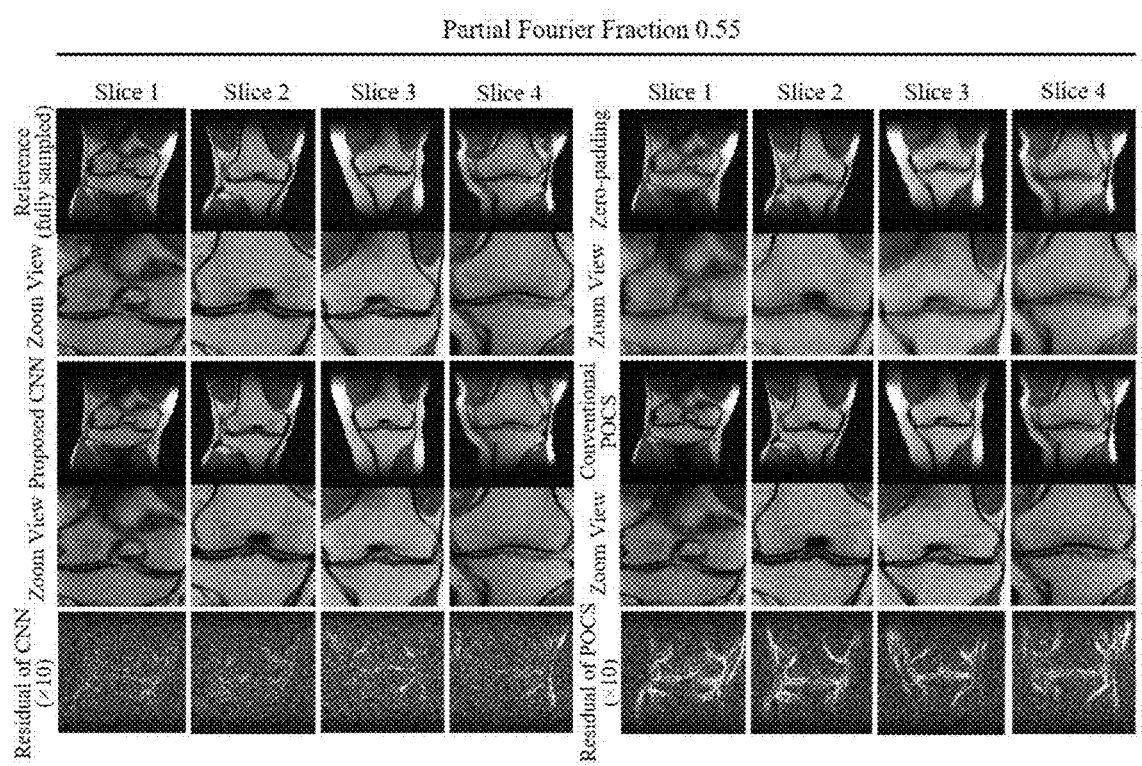
FIG. 2 shows examples of the partial Fourier reconstruction results using the trained CNN model, conventional POCS method, and simple zero-padding method. Partial Fourier fraction is 0.55 along frequency encoding direction (vertical). As shown by the residual error maps, the proposed CNN approach significantly outperforms the POCS method, especially in preserving the high frequency information without noise amplification.
Figure 3A:
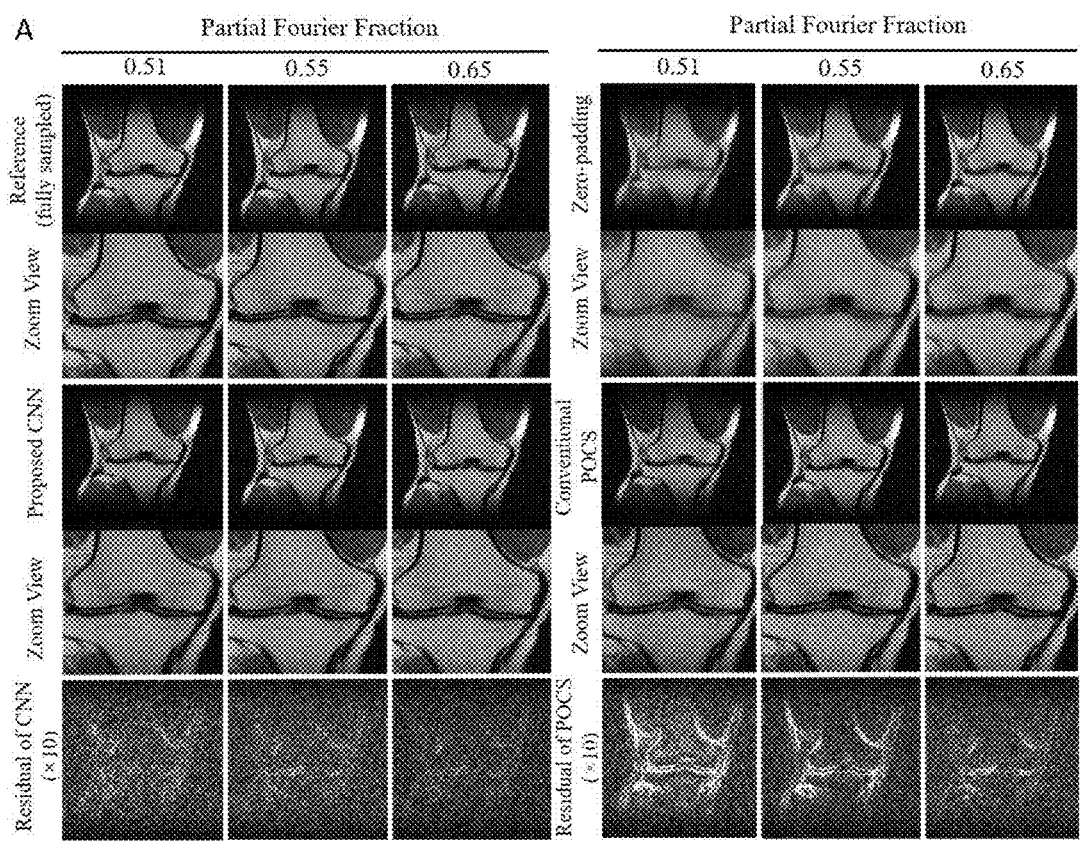
FIG. 3A shows examples of partial Fourier reconstruction results using the proposed CNN model, conventional POCS method, and simple zero-padding method for different partial Fourier fractions (0.51, 0.55 and 0.65) along frequency encoding direction (vertical). POCS and CNN yield similar performance at 0.65. However, the CNN performs better than POCS at 0.55. At 0.51 (approaching half-Fourier), POCS suffers significant high frequency information loss, while CNN preserves sharp edges without distinct noise amplification.
Figure 3B:
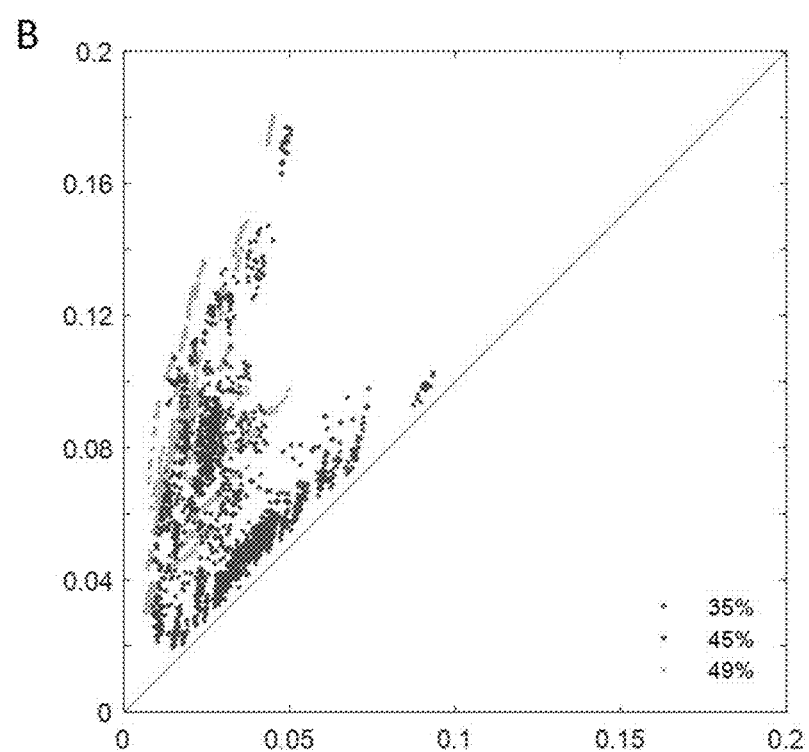
FIG. 3B is a graphical representation of image residual root mean square errors (RMSEs) of the CNN (horizontal axis) and POCS (vertical axis) methods calculated from 800 test images, clearly demonstrating robustness and superiority of our CNN method.
Figure 4:
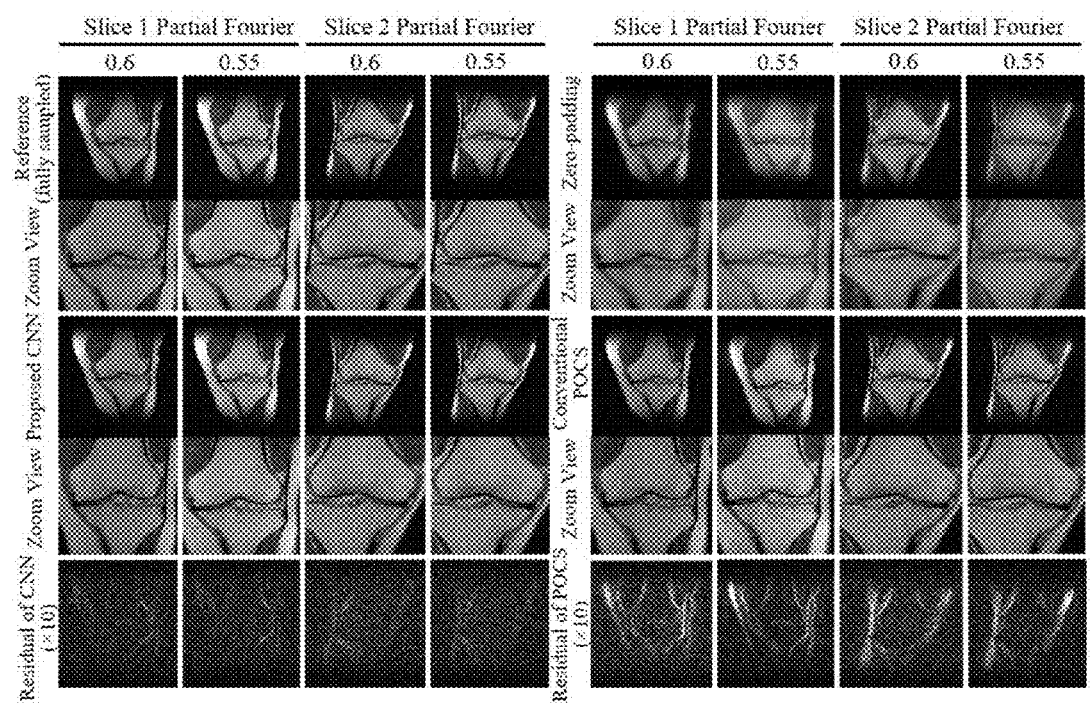
FIG. 4 shows examples of partial Fourier reconstruction results using the proposed CNN model, conventional POCS method, and simple zero-padding method. Partial Fourier fraction is 0.60 or 0.55 along phase encoding direction (horizontal). The proposed CNN approach clearly outperforms the POCS method, especially in preserving the high frequency information without noise amplification.
Figure 5:
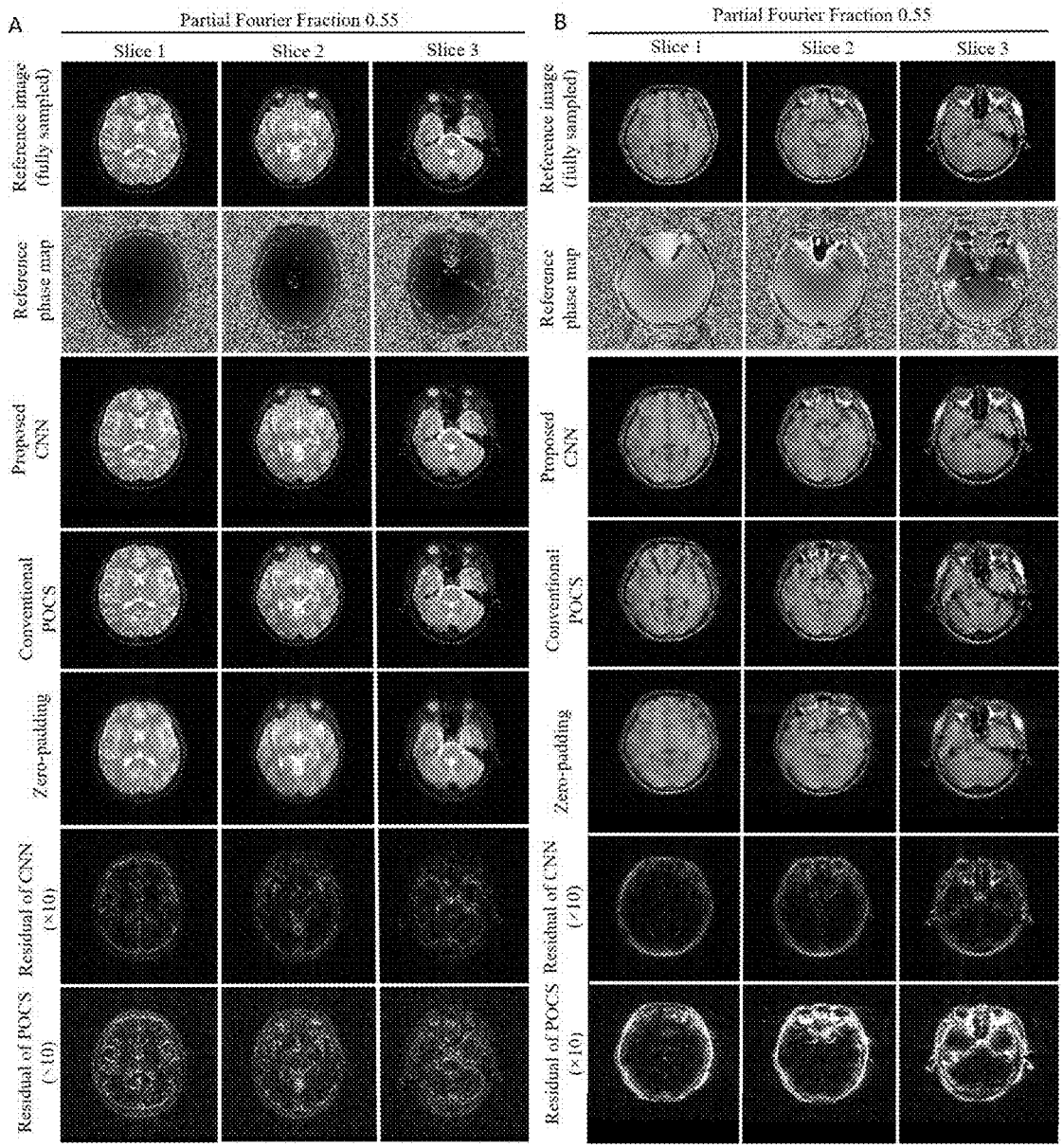
FIGS. 5A and 5B are examples of applying the knee-image-trained CNN model to partial Fourier reconstruction of brain T2-weighted FSE (A) and T1-weighted GE images (B). The partial Fourier fraction is 0.55 along phase encoding direction (vertical) for T2-weighted images results in (A) and 0.55 along frequency encoding direction (horizontal) for T1-weighted images results in (B). Red arrows indicate the artifacts of POCS method. They result mainly from the rapid local phase variations in the image, to which POCS method is vulnerable but not our proposed CNN method.

FIGS. 2 to 5 demonstrate the results of the deep learning partial Fourier reconstruction using the CNN model (shown in FIG. 1) and its superiority over the traditional reconstruction methods. For model training, validation and testing, large fully-sampled and complex human knee datasets are used. FIG. 2 shows the typical reconstruction results by the proposed CNN method and existing POCS methods for partial Fourier faction of 0.55 along the frequency encoding direction (vertical). FIG. 3 compares the performance of POCS and CNN methods at partial Fourier fractions of 0.65, 0.55 and 0.51 (nearly half-Fourier) along frequency encoding direction (vertical), together with the residual image root mean square error (RMSE) analysis of POCS and CNN results from all 800 test image datasets. FIG. 4 compares the performance of the two methods at partial Fourier fractions of 0.6 and 0.55 along the phase encoding direction (horizontal). These results clearly demonstrated that the proposed deep learning method performed better than POCS method, especially in preserving high frequency image information without amplifying noise. FIG. 5 shows the partial Fourier reconstruction of brain images using the knee-image-trained CNN model at partial Fourier fraction of 0.55 along the vertical frequency encoding direction (FIG. 5A) and along the horizontal phase encoding direction (FIG. 5B), again demonstrating the superior and robust performance of the proposed CNN method over POCS. These experimental examples indicate that the new deep learning methods robustly reconstruct partial Fourier k-space data by recovering high frequency image information/structures without noise amplification even when partial Fourier fraction approached 0.5 (i.e., half-Fourier), significantly outperforming the traditional POCS method. Further, knee-image-trained CNN model is also applicable to partial Fourier reconstruction of other organ images with different contrasts (i.e., brain T2-weighted FSE images as well as the T1-weighted GE images where rapid local phase variations often occur).

Note that such deep learning model is also applicable to the MRI image reconstruction from 3D or 4D k-space data, in which partial Fourier sampling can exist in more than one direction during phase or/and frequency encoding, or occur in non-Cartesian k-space (such as in spiral or projection sampling trajectories). It is further applicable to partial Fourier reconstruction of multiple-receiving-channel (i.e., multi-channel) k-space data.

The MRI apparatus may be configured with a deep learning system for the MRI image reconstruction in images acquired via the MRI apparatus. In some embodiments, the deep learning system may be implemented on an edge device (not shown) connected to the MRI apparatus. In some embodiments, the deep learning system may be implemented remotely, for example in a cloud in communication with the MRI apparatus. In some embodiments, portions of the deep learning system are implemented on different devices, such as any appropriate combination of the MRI apparatus, the edge device, the cloud, etc.

Example Computing Environment

Figure 6:
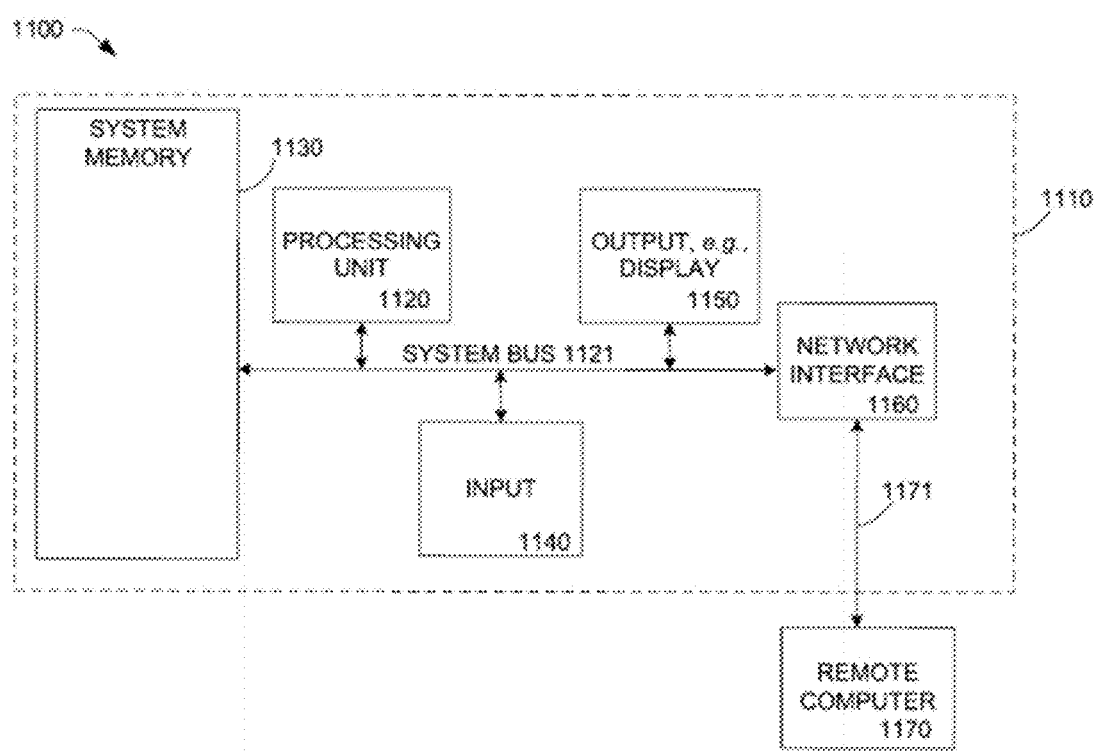
FIG. 6 illustrates a block diagram of an example electronic computing environment that can be implemented in conjunction with one or more aspects described herein.

As mentioned, advantageously, the techniques described herein can be applied to any device and/or network where analysis of data is performed. The below general purpose remote computer described below in FIG. 6 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 6 thus illustrates an example of a suitable computing system environment 1100 in which some aspects of the disclosed subject matter can be implemented, although as made clear above, the computing system environment 1100 is only one example of a suitable computing environment for a device and is not intended to suggest any limitation as to the scope of use or functionality of the disclosed subject matter. Neither should the computing environment 1100 be interpreted as having any dependency or requirement relating to any one or combination of components illustrated in the exemplary operating environment 1100.

With reference to FIG. 6, an exemplary device for implementing the disclosed subject matter includes a general-purpose computing device in the form of a computer 1110. Components of computer 1110 may include, but are not limited to, a processing unit 1120, a system memory 1130, and a system bus 1121 that couples various system components including the system memory to the processing unit 1120. The system bus 1121 may be any of several types of bus structures including a memory bus or memory controller, a peripheral bus, and a local bus using any of a variety of bus architectures.

Computer 1110 typically includes a variety of computer readable media. Computer readable media can be any available media that can be accessed by computer 1110. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 1110. Communication media typically embodies computer readable instructions, data structures, program modules, or other data in a modulated data signal such as a carrier wave or other transport mechanism and includes any information delivery media.

The system memory 1130 may include computer storage media in the form of volatile and/or nonvolatile memory such as read only memory (ROM) and/or random access memory (RAM). A basic input/output system (BIOS), containing the basic routines that help to transfer information between elements within computer 1110, such as during start-up, may be stored in memory 1130. Memory 1130 typically also contains data and/or program modules that are immediately accessible to and/or presently being operated on by processing unit 1120. By way of example, and not limitation, memory 1130 may also include an operating system, application programs, other program modules, and program data.

The computer 1110 may also include other removable/non-removable, volatile/nonvolatile computer storage media. For example, computer 1110 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 1121 through a non-removable memory interface such as an interface, and a magnetic disk drive or optical disk drive is typically connected to the system bus 1121 by a removable memory interface, such as an interface.

A user can enter commands and information into the computer 1110 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 1120 through user input 1140 and associated interface(s) that are coupled to the system bus 1121, but may be connected by other interface and bus structures, such as a parallel port, game port, or a universal serial bus (USB). A graphics subsystem can also be connected to the system bus 1121. A projection unit in a projection display device, or a HUD in a viewing device or other type of display device can also be connected to the system bus 1121 via an interface, such as output interface 1150, which may in turn communicate with video memory. In addition to a monitor, computers can also include other peripheral output devices such as speakers which can be connected through output interface 1150.

The computer 1110 can operate in a networked or distributed environment using logical connections to one or more other remote computer(s), such as remote computer 1170, which can in turn have media capabilities different from device 1110. The remote computer 1170 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 1110. The logical connections depicted in FIG. 6 include a network 1171, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 1110 can be connected to the LAN 1171 through a network interface or adapter. When used in a WAN networking environment, the computer 1110 can typically include a communications component, such as a modem, or other means for establishing communications over the WAN, such as the Internet. A communications component, such as wireless communications component, a modem and so on, which can be internal or external, can be connected to the system bus 1121 via the user input interface of input 1140, or other appropriate mechanism. In a networked environment, program modules depicted relative to the computer 1110, or portions thereof, can be stored in a remote memory storage device. It will be appreciated that the network connections shown and described are exemplary and other means of establishing a communications link between the computers can be used.

Example Networking Environment

Figure 7:
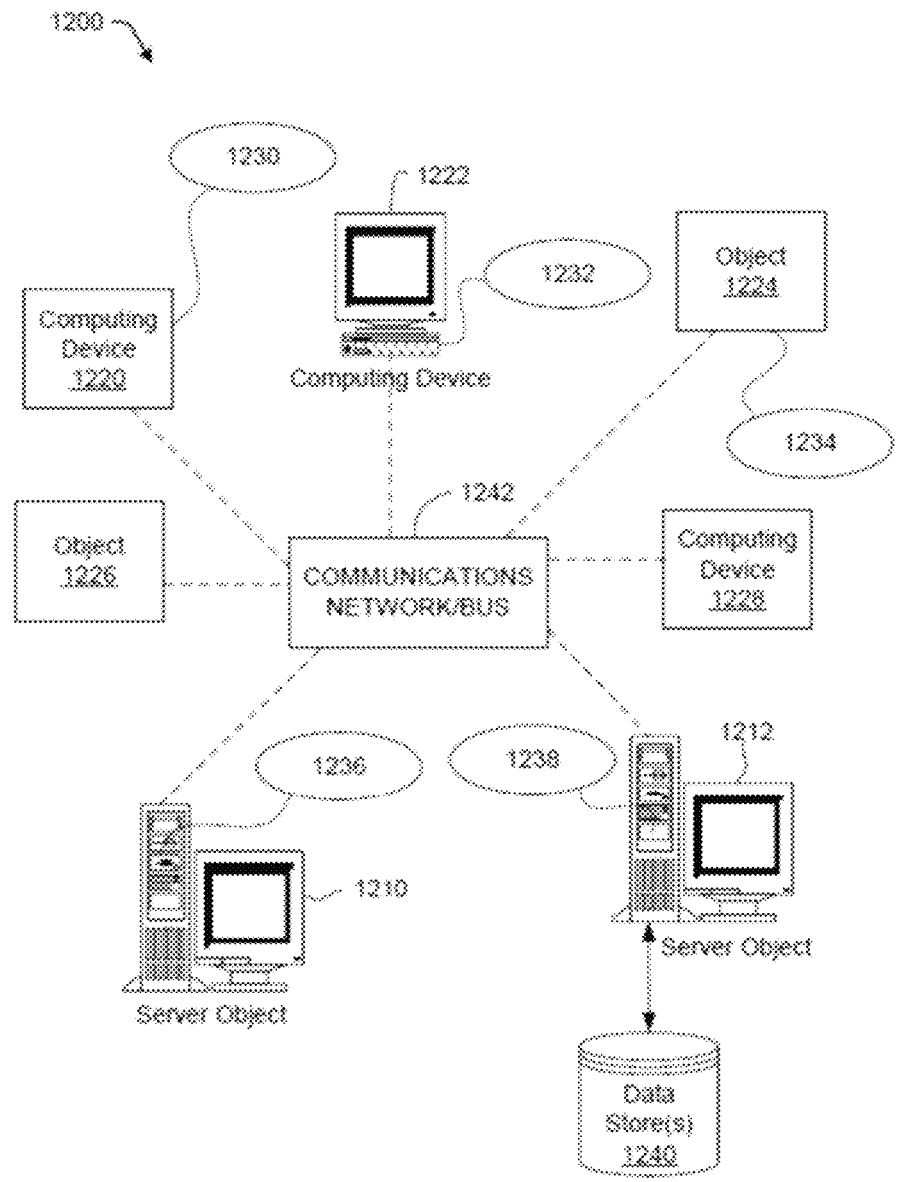
FIG. 7 depicts a block diagram of an example data communication network that can be operable in conjunction with various aspects described herein.

FIG. 7 provides a schematic diagram of an exemplary networked or distributed computing environment 1200. The distributed computing environment comprises computing objects 1210, 1212, etc. and computing objects or devices 1220, 1222, 1224, 1226, 1228, etc., which may include programs, methods, data stores, programmable logic, etc., as represented by applications 1230, 1232, 1234, 1236, 1238 and data store(s) 1240. It can be appreciated that computing objects 1210, 1212, etc. and computing objects or devices 1220, 1222, 1224, 1226, 1228, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 1240 can include one or more cache memories, one or more registers, or other similar data stores disclosed herein.

Each computing object 1210, 1212, etc. and computing objects or devices 1220, 1222, 1224, 1226, 1228, etc. can communicate with one or more other computing objects 1210, 1212, etc. and computing objects or devices 1220, 1222, 1224, 1226, 1228, etc. by way of the communications network 1242, either directly or indirectly. Even though illustrated as a single element in FIG. 7, communications network 1242 may comprise other computing objects and computing devices that provide services to the system of FIG. 7, and/or may represent multiple interconnected networks, which are not shown. Each computing object 1210, 1212, etc. or computing object or devices 1220, 1222, 1224, 1226, 1228, etc. can also contain an application, such as applications 1230, 1232, 1234, 1236, 1238, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 7, as a non-limiting example, computing objects or devices 1220, 1222, 1224, 1226, 1228, etc. can be thought of as clients and computing objects 1210, 1212, etc. can be thought of as servers where computing objects 1210, 1212, etc., acting as servers provide data services, such as receiving data from client computing objects or devices 1220, 1222, 1224, 1226, 1228, etc., storing of data, processing of data, transmitting data to client computing objects or devices 1220, 1222, 1224, 1226, 1228, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1242 or bus is the Internet, for example, the computing objects 1210, 1212, etc. can be Web servers with which other computing objects or devices 1220, 1222, 1224, 1226, 1228, etc. communicate via any of a number of known protocols, such as the hypertext transfer protocol (HTTP). Computing objects 1210, 1212, etc. acting as servers may also serve as clients, e.g., computing objects or devices 1220, 1222, 1224, 1226, 1228, etc., as may be characteristic of a distributed computing environment.

Reference throughout this specification to "one embodiment," "an embodiment," "an example," "an implementation," "a disclosed aspect," or "an aspect" means that a particular feature, structure, or characteristic described in connection with the embodiment, implementation, or aspect is included in at least one embodiment, implementation, or aspect of the present disclosure. Thus, the appearances of the phrase "in one embodiment," "in one example," "in one aspect," "in an implementation," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

While the invention is explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method for magnetic resonance imaging (MRI) reconstruction of partial Fourier k-space data using deep learning models, comprising:
   obtaining large training data comprising complex MRI images or fully-sampled k-space data, wherein the obtaining comprises obtaining the large training data via at least one of MRI data acquisition or post-acquisition retrospective k-space data rebinning;
   training, using the training data, artificial neural networks to predict high-quality complex MRI images or complete k-space data from incomplete k-space data that are partially sampled;
   generating, using the artificial neural networks trained with the training data, high-quality complex MRI images or complete k-space data from individual incomplete k-space data; and
   wherein the individual incomplete k-space data has a same k-space sampling trajectory as the training data.

2. The method of claim 1, wherein the training data comprises at least one of two-dimensional (2D) data, three-dimensional (3D) data, or multi-channel data.

3. The method of claim 1, wherein the complex MRI images or fully sampled k-space data comprises at least one of two-dimensional (2D) data, three-dimensional (3D) data, or multi-channel data.

4. The method of claim 1, wherein the incomplete k-space data comprises at least one of two-dimensional (2D) data, three-dimensional (3D) data, or multi-channel data.

5. The method of claim 1, wherein the incomplete k-space data is partially sampled in one or more directions using Cartesian k-space sampling via at least one of phase encoding or a frequency encoding scheme.

6. The method of claim 1, wherein the incomplete k-space data is partially sampled in an angular direction using polar k-space sampling via a projection encoding scheme.

7. The method of claim 1, wherein the incomplete k-space data is partially sampled through non-Cartesian and non-polar k-space trajectories.

8. The method of claim 1, wherein the incomplete k-space data is obtained using a Cartesian spiral sampling scheme.

9. A method for magnetic resonance imaging (MRI) reconstruction of partial Fourier k-space data using deep learning models, comprising:
   obtaining large training data comprising complex MRI images or fully-sampled k-space data, wherein the obtaining comprises obtaining the large training data using at least one of MRI data acquisition or post-acquisition retrospective k-space data rebinning;
   training, using the training data, artificial neural networks to predict high-quality complex MRI images or complete k-space data from incomplete k-space data that are partly sampled and have a same k-space sampling trajectory as the training data; and
   generating high-quality complex MRI images or complete k-space data from individual incomplete k-space data that are partially sampled by using the artificial neural networks.

10. The method of claim 9, wherein the artificial neural networks accommodate data with dimensions higher than two-dimensional (2D) and that is multi-channel.

11. The method of claim 9, wherein the artificial neural networks are based in a complex image domain or a k-space domain.

12. The method of claim 9, wherein the artificial neural networks comprise a convolutional neural network (CNN).

13. The method of claim 9, wherein the artificial neural networks comprise a generative adversarial network (GAN).

14. The method of claim 9, wherein the artificial neural networks comprise an autoencoder network.

15. The method of claim 9, wherein the artificial neural networks accommodate multi-receiving-channel data obtained via parallel imaging.

16. A method for magnetic resonance imaging (MRI) reconstruction of partial Fourier k-space data using deep learning models, comprising:
   obtaining large training data comprising complex MRI images or fully-sampled k-space data, wherein the obtaining comprises obtaining the large training data via at least one of MRI data acquisition or post-acquisition retrospective k-space data rebinning;
   training, using the training data, artificial neural networks to predict high-quality complex MRI images or complete k-space data from incomplete k-space data; and
   generating, using the artificial neural networks trained with the training data, high-quality complex MRI images or complete k-space data from individual incomplete k-space data,
   wherein
   the training data and the individual incomplete k-space data are not required to be from a same or similar image orientations, objects, anatomical structures, MRI contrasts, MRI scanners, or MRI field strength, and
   the training data has a same k-space sampling trajectory as the individual incomplete k-space data.

17. The method of claim 16, wherein the training data is acquired from one or more real MRI scanners.

18. A system for magnetic resonance imaging (MRI) reconstruction of partial Fourier k-space data using deep learning models, comprising:
   a memory that stores computer executable components; and
   a processor that executes the computer executable components stored in the memory, wherein the computer executable components comprise:

a data acquisition component configured to obtain, via at least one of MRI data acquisition or post-acquisition retrospective k-space data rebinning, large training data comprising complex MRI images or fully-sampled k-space data;

a training component configured to train, using the training data, artificial neural networks to predict residual complex images from incomplete k-space data; and a reconstruction component configured to generate, using the artificial neural networks trained with the training data, the high-quality complex MRI images or complete k-space data from the individual incomplete k-space data, wherein the training data has a same k-space sampling trajectory as the individual incomplete k-space.

19. A non-transitory computer readable medium comprising executable instructions that, in response to execution by a processor, facilitate performance of operations, comprising:

obtaining large training data comprising complex magnetic resonance imaging (MRI) images or fully-sampled k-space data, wherein the obtaining comprises obtaining the large training data via at least one of MRI data acquisition or post-acquisition retrospective k-space data rebinning;

training, using the training data, artificial neural networks to predict high-quality complex MRI images or complete k-space data from incomplete k-space data; and generating, using the artificial neural networks trained with the training data, high-quality complex MRI images or complete k-space data from individual incomplete k-space data;

wherein the training data has a same k-space sampling trajectory as the individual incomplete k-space data.

* * * * *